(12) United States Patent
LaBerge et al.

(10) Patent No.: US 7,284,169 B2
(45) Date of Patent: Oct. 16, 2007

(54) SYSTEM AND METHOD FOR TESTING WRITE STROBE TIMING MARGINS IN MEMORY DEVICES

(75) Inventors: Paul A. LaBerge, Shoreview, MN (US); Keith J. Lunzer, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 151 days.

(21) Appl. No.: 11/298,163

(22) Filed: Dec. 8, 2005

(65) Prior Publication Data

US 2007/0136627 A1  Jun. 14, 2007

(51) Int. Cl.
  G11C 29/00 (2006.01)
  G06F 11/00 (2006.01)
(52) U.S. Cl. .................. 714/718; 714/798; 714/735
(58) Field of Classification Search ............... None
  See application file for complete search history.

(56) References Cited

U.S. PATENT DOCUMENTS

| | | | |
|---|---|---|---|
| 4,637,020 A | 1/1987 | Schinabeck ................ 371/20 |
| 4,646,299 A | 2/1987 | Schinabeck et al. .......... 371/20 |
| 4,717,012 A | 1/1988 | Swapp et al. ............... 198/425 |
| 4,776,747 A | 10/1988 | Swapp et al. ............... 414/417 |
| 4,928,062 A | 5/1990 | Miles et al. ............ 324/158 R |
| 5,055,779 A | 10/1991 | Kerschner et al. ........ 324/158 F |
| 5,321,702 A * | 6/1994 | Brown et al. ............... 714/744 |
| 5,539,305 A | 7/1996 | Botka ..................... 324/158.1 |
| 5,652,524 A | 7/1997 | Jennion et al. ............. 324/765 |
| 5,751,151 A | 5/1998 | Levy et al. ................. 324/537 |
| 5,805,619 A * | 9/1998 | Gardner et al. ............. 714/814 |
| 5,864,565 A | 1/1999 | Ochoa et al. ................. 371/24 |
| 5,903,163 A | 5/1999 | Tverdy et al. ............... 324/760 |
| 6,004,142 A | 12/1999 | Wark ........................ 439/74 |
| 6,147,506 A | 11/2000 | Ahmad et al. ............... 324/760 |
| 6,373,268 B1 | 4/2002 | Dunlap et al. .............. 324/755 |
| 6,407,567 B1 | 6/2002 | Etter ........................ 324/760 |
| 6,438,721 B1 * | 8/2002 | Wente ....................... 714/731 |
| 6,449,741 B1 | 9/2002 | Organ et al. ................ 714/724 |
| 6,551,844 B1 | 4/2003 | Eldridge et al. ............. 438/14 |
| 6,583,636 B2 | 6/2003 | Brule ........................ 324/755 |
| 6,631,488 B1 | 10/2003 | Stambaugh et al. ......... 714/746 |
| 6,696,848 B2 | 2/2004 | Robinson .................... 324/755 |
| 6,791,317 B1 | 9/2004 | Walsh et al. .............. 324/158.1 |
| 6,829,181 B1 | 12/2004 | Seitoh ....................... 365/201 |
| 6,856,154 B2 | 2/2005 | Song et al. ................ 324/754 |
| 7,243,278 B2 * | 7/2007 | Arkin ........................ 714/724 |
| 2004/0034825 A1 | 2/2004 | Jeddeloh ..................... 714/733 |
| 2005/0023560 A1 | 2/2005 | Ahn et al. ................... 257/200 |
| 2005/0060600 A1 | 3/2005 | Jeddeloh ....................... 714/5 |
| 2005/0278495 A1 | 12/2005 | Lee ........................... 711/168 |
| 2005/0283681 A1 | 12/2005 | Jeddeloh ..................... 714/42 |
| 2006/0107186 A1 | 5/2006 | Cowell et al. .............. 714/776 |
| 2006/0206761 A1 | 9/2006 | Jeddeloh ..................... 714/29 |

* cited by examiner

Primary Examiner—Christine T. Tu
(74) Attorney, Agent, or Firm—Dorsey & Whitney LLP (57) ABSTRACT

Write strobe preamble/postamble test circuitry includes a test signal generator generating first and second digital signals. Also included are a pair of phase interpolators for varying the transition times of respective transmitter clock signals. When enabled, a transmitter uses the transmitter clock signals to transmit a write data strobe signal corresponding to the first and second digital signals to memory devices being tested. The transmitter is enabled by an enable signal generated by a third phase interpolator. By varying the timing of the enable signal, the third phase interpolator can vary the duration of preambles and postambles of respective write data strobe signals.

36 Claims, 9 Drawing Sheets

SYSTEM AND METHOD FOR TESTING WRITE STROBE TIMING MARGINS IN MEMORY DEVICES

TECHNICAL FIELD

This invention relates to testing integrated circuits such as memory devices, and, more particularly, to a system and method for testing the timing margins of data strobe preambles and postambles applied to memory devices.

BACKGROUND OF THE INVENTION

During the fabrication of integrated circuits such as memory devices, it is conventional to test such integrated circuits at several stages during the fabrication process. For example, the integrated circuits are normally connected to a tester with a probe card when the integrated circuits are still in wafer form. In a final test occurring after the integrated circuits have been diced from the wafer and packaged, the integrated circuits are placed into sockets on a load board. The load board is then placed on a test head, typically by a robotic handler. The test head makes electrical contact with conductors on the load board that are connected to the integrated circuits. The test head is connected through a cable to a high-speed tester so that the tester can apply signals to and receive signals from the integrated circuits.

While the above-described testing environment works well in many applications, it is not without its limitations and disadvantages. For example, it is very difficult to test various timing characteristics of the integrated circuits, particularly at the high operating speeds for which such integrated circuits are designed. This difficulty in testing timing characteristics results primarily from the propagation delays in the cable coupling the tester to the test head. The cables that are typically used in such testing environments are often fairly long, thus making the delays of signals coupled to and from the integrated circuits correspondingly long and often difficult to predict.

Another problem with the above-described testing environment is that it may not accurately simulate the conditions in which the integrated circuits will be actually used. In actual use, integrated circuits, such as dynamic random access memory ("DRAM") devices are typically mounted on a printed circuit board. Signals are applied to the integrated circuits by other integrated circuits mounted on the board, and signals generated by the integrated circuits are received by other integrated circuits mounted on the board. In most applications, signals are not coupled to and from the integrated circuits through long cables coupled to distant electronic devices. Therefore, the testing environment is normally quite different from the environment in which the integrated circuits will operate in normal use.

While techniques have been developed to deal with these difficulties, the use of these techniques results in testers that are highly complex and often very expensive. A large number of testers are normally required for a high capacity semiconductor fabrication plant, thus greatly increasing the cost of the plant and the expense of testing the integrated circuits.

One improved testing system that has been proposed is to fabricate an integrated test circuit that performs most if not all of the functions of conventional testers, and mount the integrated test circuit on the test head or load board to which the integrated circuits being tested are coupled. By placing the testing function on the test head or load board itself, the problems inherent in coupling test signals between a testing system and a test head are eliminated. As a result, the circuits can be tested in a more realistic environment. Furthermore, since even custom integrated circuits can be fabricated relatively inexpensively, the cost of testing systems can be greatly reduced.

Figure 1:
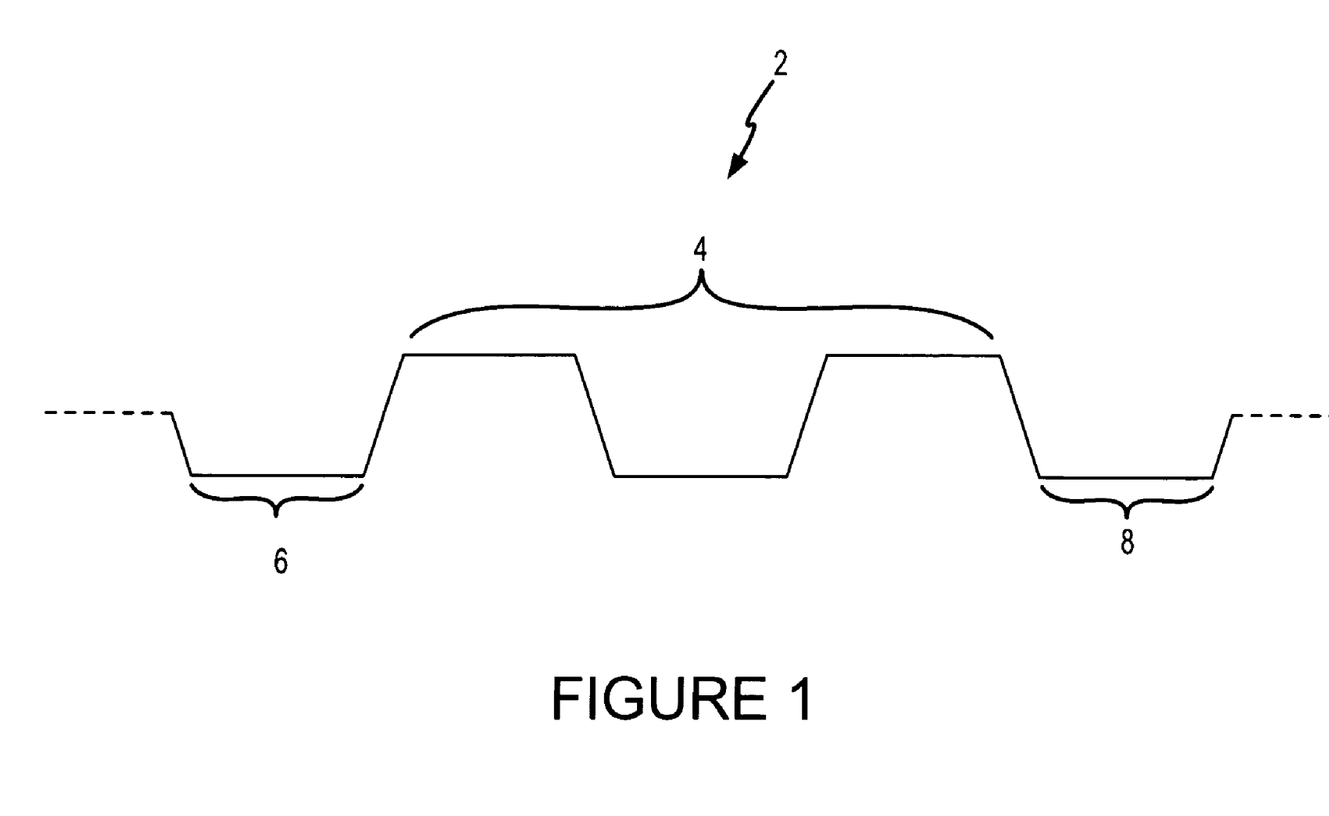
FIG. 1 is a timing diagram showing a typical write data strobe signal having a preamble and a postamble.

One difficulty in using an integrated test circuit in this manner stems from the difficulty in accurately testing timing margins of memory devices. For example, synchronous memory devices normally receive a write data strobe signal, which is commonly abbreviated as "DQS." A typical DQS signal 2 is shown in FIG. 1. The DQS signal 2 includes an active portion 4 containing several logic level transitions, which are synchronized to write data signals that are also applied to the memory devices. The active portion 4 of the DQS signal 2 is preceded by a preamble 6, and it is followed by a postamble 8. In the example shown in FIG. 1, the active portion 4 includes two falling edge transitions and three rising edge transitions, the first of which terminates the preamble 6 and the last of which initiates the postamble 8.

Specifications for synchronous memory devices normally specify a range of acceptable timing values for the DQS preamble 6 and postamble 8. It is important to ensure that a memory device being tested meets these specifications. The ability of a memory device to meet the preamble and postamble width specifications is normally tested by applying DQS signals to the memory device having preambles and postambles that span the range of acceptable values. The ability of the memory device to operate properly with all of the preambles and postambles in the specified range is then determined by reading data from the memory device that have been written using DQS signals with the various preamble and postamble values.

Unfortunately, with modern high-speed memory devices, it is difficult to generate test signals that have precise but very small time durations, such as preambles and postambles. Expensive high-speed testers of the type normally used to test memory devices are capable of precisely controlling the timing of each transition of the DQS signal, including the preambles and postambles. However, the lack of a good timing mechanism that can easily be fabricated in an integrated circuit threatens to preclude the use of an integrated test circuit mounted on a load board or test head from accurately testing whether a memory device meets preamble and postamble specifications.

There is therefore a need for a testing system and method that can be easily fabricated in an integrated circuit to allow an integrated test circuit mounted on a load board, test head or the like to generate DQS signals having preambles and postambles with very precisely controlled durations.

SUMMARY OF THE INVENTION

A system and method of testing memory devices is used to determine if the memory devices meet specifications for the duration of write data strobe preambles and postambles. The system includes a write strobe generator that generates a digital signal having a selectable number of transitions between first and second logic levels. The system also includes a phase interpolator that generates an enable clock signal by phase shifting an input clock signal by an amount that is controlled by a phase control signal. An enable circuit receives the enable clock signal from the phase interpolator and generates an active enable signal. When the enable circuit receives a DQS enable signal from a control circuit, it generates an active enable signal responsive to a subsequent transition of the enable clock signal. A transmitter receives the digital signal from the write strobe generator and the enable signal from the enable circuit. The transmitter transmits as a write strobe signal the digital signal during the period that the enable signal is active. In addition to applying the DQS enable signal to the enable circuit, the control circuit applies the phase control signal to the phase interpolator to control the timing and duration of the enable signal generated by enable circuit. As a result, the control circuit determines the durations of first and last portions of the digital signal that are used as write strobe preambles and postambles, respectively.

DETAILED DESCRIPTION

Figure 2:
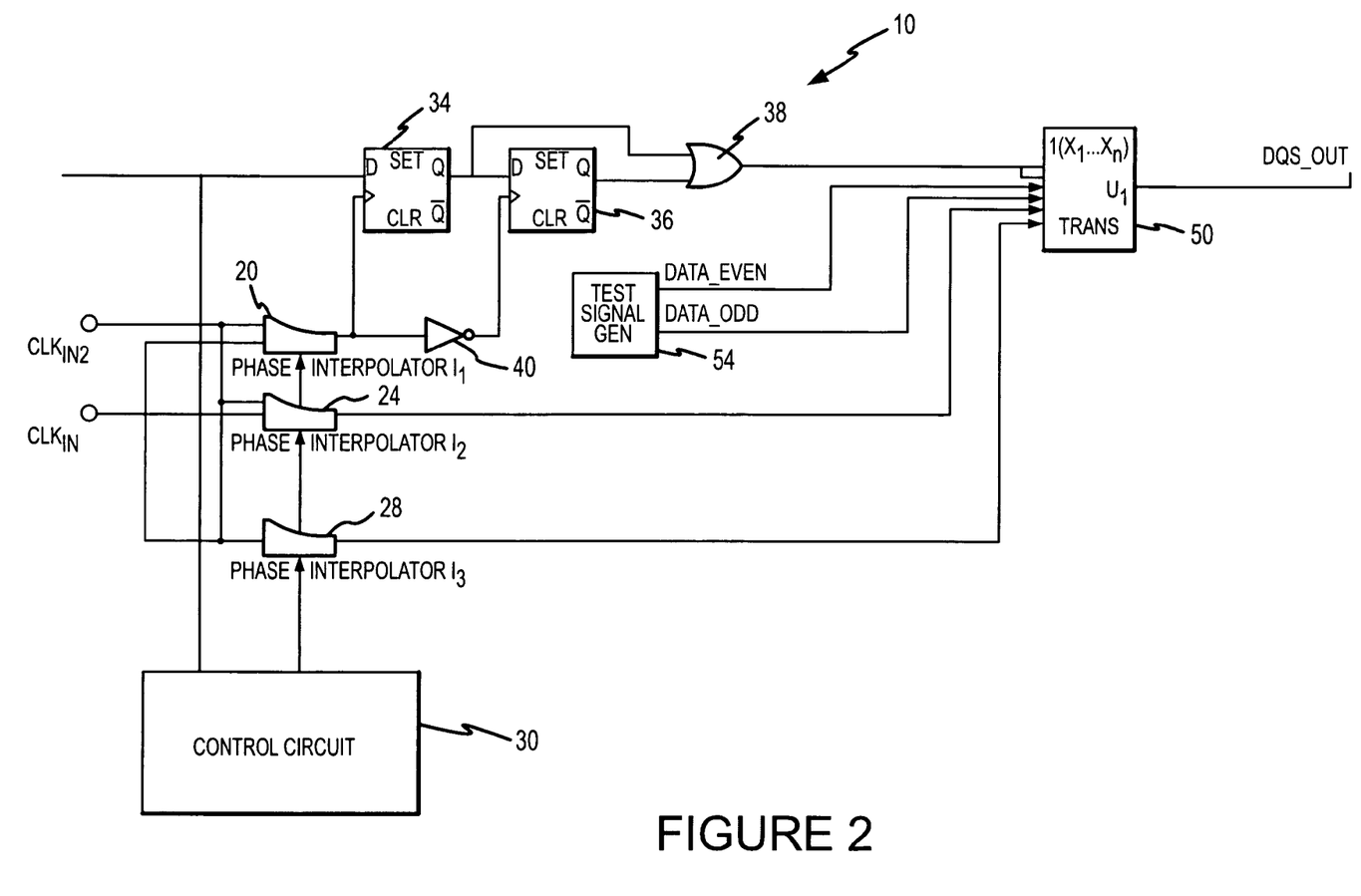
FIG. 2 is a block diagram of a write strobe preamble/postamble test system according to one example of the invention.

A DQS preamble/postamble test system 10 according to one example of the invention is illustrated in FIG. 2. The test system 10 includes three phase interpolators 20, 24, 28, all of which are driven by a first common clock signal $CLK_{IN}$ and a second common clock signal $CLK_{IN2}$, which has a fixed phase off set from the $CLK_{IN}$ signal. However, the clock signal driving the phase interpolators 20, 24, 28 need not be common to all of the phase interpolators. As is well-known in the art, a phase interpolator produces a delayed signal from one clock input signal by interpolating between the clock signals by a precisely controlled amount. The degree of precision of the delayed signal depends on the precision of the input signal frequency.

A $CLK_{EN}$ signal at the output of the phase interpolator 20 is applied to the clock input of a flip-flop 34, which also receives an ENABLE signal at its data input. The output of the flip-flop 34 is applied to the data input of a second flip-flop 36 and to one input of an OR gate 38. The output of the OR gate 38 is therefore high whenever the ENABLE signal is active high at the rising edge of the $CLK_{EN}$ signal.

The $CLK_{EN}$ signal is also applied through an inverter 40 to the clock input of the flip-flop 36. Therefore, the flip-flop 34 is clocked on the rising edge of the $CLK_{EN}$ signal, and the flip-flop 36 is clocked on the falling edge of the $CLK_{EN}$ signal. The output of the flip-flop 36 is applied to the other input of the OR gate 38. As a result, a $DQS_{EN}$ signal at the output of the OR gate 38 is high whenever the output of either flip-flop 34 or 36 is high. The output of the flip-flop 36 becomes high on the falling edge of $CLK_{EN}$ after the output of the flip-flop 34 has transitioned high. Therefore, the $DQS_{EN}$ will transition high on the rising edge of the $CLK_{EN}$ signal after the ENABLE signal transitions high. The $DQS_{EN}$ signal will transition low when the ENABLE signal transitions low followed by a rising edge of the $CLK_{EN}$ signal and a falling edge of the $CLK_{EN}$ signal. The $DQS_{EN}$ signal is applied to both the $EN_{EVEN}$ and the $EN_{ODD}$ inputs of a transmitter 50, the operation of which will be explained below.

The transmitter 50 also has $D_{EVEN}$ and $D_{ODD}$ inputs that receive Data Even and Data Odd signals, respectively, from respective outputs of a test signal generator 54. As explained below in greater detail in connection with the timing diagram of FIG. 5, the logic levels of the Data Even and Data Odd signals generated by the test signal generator 54 will serve as the DQS signal logic levels output by the test system 10.

The transmitter 50 also has a $T_0$ input that receives a Tx0 signal from the output from the phase interpolator 24, and a $T_1$ input that receives a Tx1 signal from the output from the phase interpolator 28. The timing of the transitions of these signals Tx0, Tx1 can be individually controlled by controlling the phase shifts of the phase interpolators 24, 28, respectively.

Figures 3, 4:
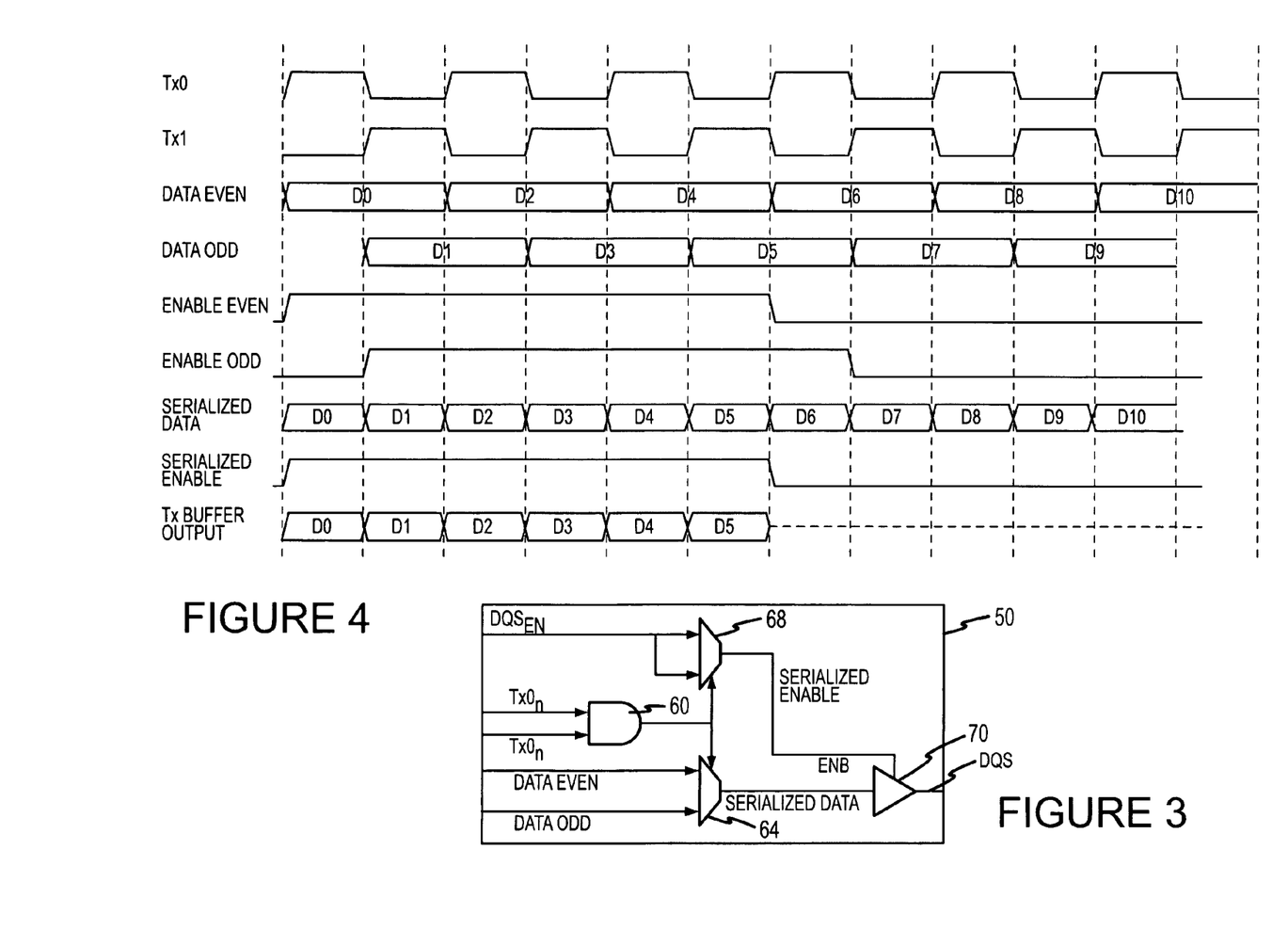
FIG. 3 is a logic diagram showing one example of a transmitter that is used in the test system of FIGS. 2 and 6.
FIG. 4 is a timing diagram showing some of the signals present in the transmitter of FIG. 3.

The internal components of the transmitter 50 are shown in FIG. 3, and its operation will be explained with reference to the timing diagram of FIG. 4. The Tx0 signal is applied to a non-inverting input of an AND gate 60, and the Tx1 signal is applied to an inverting input of the AND 60. The Tx0 and Tx1 signals are shown in lines 1 and 2 of FIG. 4 as being the compliment of each other, although that relationship between the Tx0 and Tx1 signals is not required. In operation, the AND gate 60 outputs a high whenever the Tx0 signal is high and the Tx1 signal is low. Because the Tx0 and Tx1 signals are the compliments of each other in the example shown in FIG. 4, the output of the AND gate 60 is identical to the Tx0 signal.

As shown in lines 3 and 4 of FIG. 4, the Data Even and Data Odd signals are valid for one full period of the Tx0 and Tx1 signals. The Data Even signal is valid in synchronism with the Tx0 signal, and the Data Odd signal is valid in synchronism with the Tx1 signal. These signals are applied to respective inputs of a multiplexer 64, which is controlled by the output of the AND gate 60. When the output of the AND gate 60 is high, the Data Even signal is coupled to the output of the multiplexer 64, and when the output of the AND gate 60 is low, the Data Odd signal is coupled to the output of the multiplexer 64. A Serialized Data signal from the output of the AND gate 60 is shown in the seventh line of FIG. 4. The Serialized Data signal alternately corresponds to the data even signal and the data odd signal, and each signal is present for only one-half the period of the Tx0 and Tx1 signals. Each Data Even signal starts at the rising edge of the Tx0 signal, and the timing at which each Data Even signal starts is therefore controlled by the phase interpolator 24. Similarly, each Data Odd signal starts at the rising edge of the Tx1 signal, and the timing at which each Data Odd signal starts is therefore controlled by the phase interpolator 28.

The transmitter 50 also includes a second multiplexer 68 having two inputs that receives respective Enable Even and Enable Odd signals. In the test system, the Enable Even and Enable Odd signals are both identical to the $DQS_{EN}$ signal.

However, in the timing diagram example shown in FIG. 4, they are shown in lines 4 and 5 as being different from each other. The multiplexer 68 operates in the same manner as the multiplexer 64, and it therefore couples the Enable Even signal to its output when the Tx0 signal is high, and it couples the Enable Odd signal to its output when the Tx1 signal is high. A Serialized Enable signal output from the multiplexer 68 is shown eighth line of FIG. 4. However, in the test system the Serialized Enable signal will be identical to the $DQS_{EN}$ signal since the $DQS_{EN}$ signal is applied to both inputs of the multiplexer 68.

With further reference to FIG. 3, the Serialized Enable signal is applied to the enable input of a buffer 70, which receives the Serialized Data signal at its input. As shown in the last line of FIG. 4, the buffer 70 outputs the Serialized Data whenever the Serialized Enable signal is high.

Returning to FIG. 2, the operation of the test system 10 will now be explained with reference to the timing diagram shown in FIG. 5. In the example shown in FIG. 5, the phase interpolators 24, 28 are adjusted so that the Tx0 and Tx1 signals shown in lines 1 and 2 are again the compliments of each other. However, the phase interpolator 20 is adjusted so that the $CLK_{EN}$ signal shown in line 3 of FIG. 5 lags the Tx0 signal by slightly more than 90 degrees. As shown in the fourth line, the ENABLE signal becomes active high coincident with the rising edge of the Tx1 signal at time $t_0$. The high ENABLE signal is clocked into the flip-flop 34 responsive to the subsequent rising edge of the $CLK_{EN}$ signal from the phase interpolator 20 at time $t_2$, thereby transitioning the $DQS_{E0}$ signal high, as shown in line 5. As explained above, the high $DQS_{E0}$ signal at the output of the flip-flop 34 is coupled through the OR gate 38 to make the $DQS_{EN}$ signal high, as shown in line 7. The timing of the phase interpolator 20 thus determines when the $DQS_{EN}$ becomes active high. On the next falling edge of the $CLK_{IN}$ signal, the high $DQS_{E0}$ signal is clocked into the flip-flop 36, thereby making $DQS_{E1}$ signal high at time $t_4$, as shown in line 6. However, this transition of the $DQS_{E1}$ signal has no effect on the $DQS_{EN}$ signal since the OR gate 38 is already outputting the high from the flip-flop 34.

Figure 5:
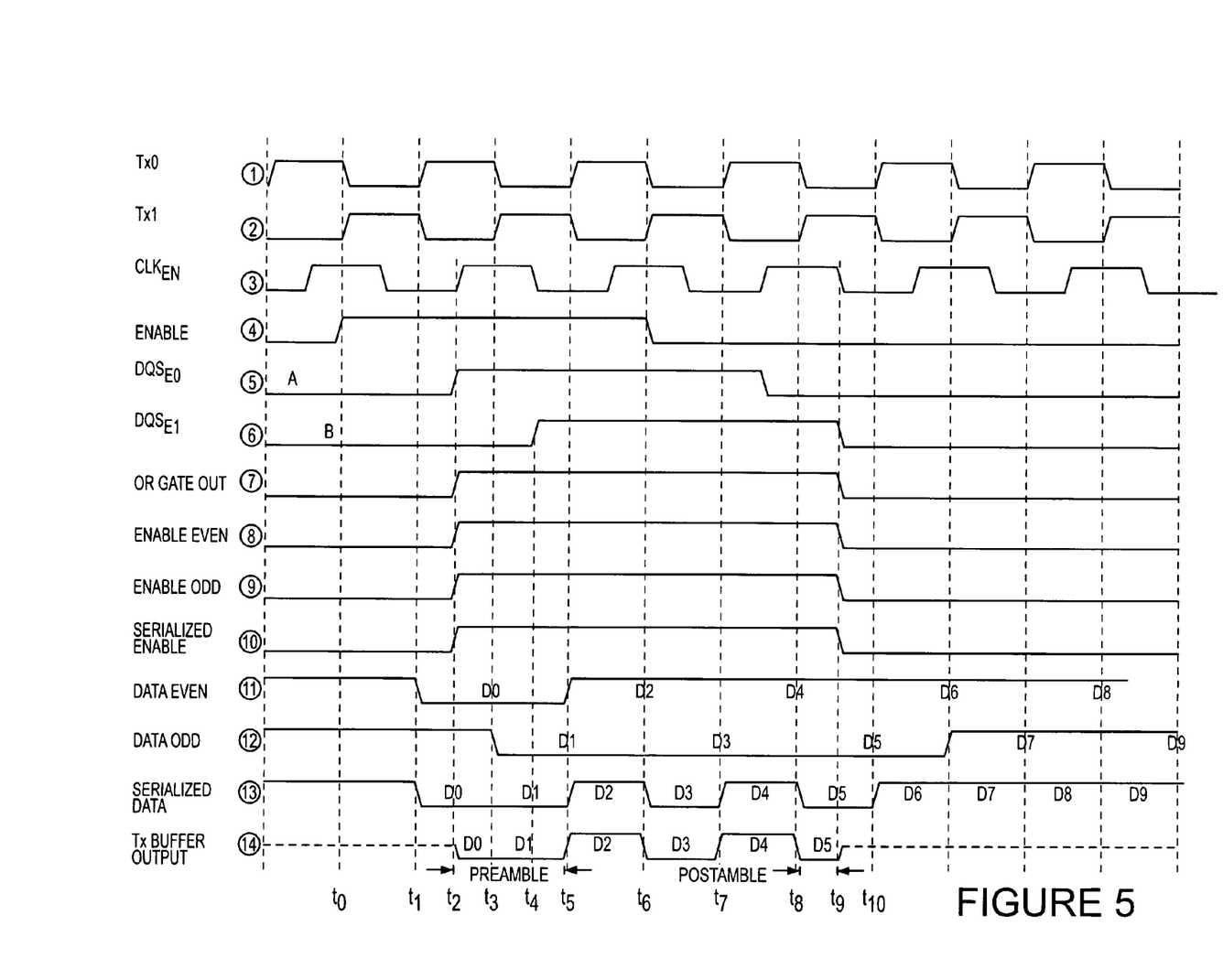
FIG. 5 is a timing diagram showing one example of signals that are present in the test system of FIG. 2.

As shown in the example of FIG. 5, the test signal generator 54 outputs a Data Even signal that is initially high, but transitions low at time $t_1$, as shown in line 11. Similarly, the Data Odd signal from the test signal generator 54 shown in line 12 is also initially high, but transitions low at time $t_3$. As explained above, the multiplexer 64 (FIG. 3) produces a Serialized Data signal that is the same as the Data Even signal responsive to the rising edge of the Tx0 signal, and is the same as the Data Odd signal responsive to the rising edge of the Tx1 signal. Therefore, the Serialized Data signal is the same as the low Data Even signal starting at time $t_1$, the low Data Odd signal starting at time $t_3$, the high Data Even signal starting at time $t_5$, the low Data Odd signal starting at time $t_6$, the high Data Even signal starting at time $t_7$, and the low Data Odd signal starting at time $t_8$. The result is a Serialized Data signal shown in the line 13 that has a relatively long logic low level between times $t_1$ and $t_5$, a set of 4 signal transitions between $t_5$ and $t_8$, and a short logic low level between $t_8$ and $t_9$. As explained below, in testing a memory device, a portion of the logic low level between times $t_1$ and $t_5$ will serve as the preamble of the DQS signal, a portion of the short logic low level between times $t_8$ and $t_9$ will serve as the postamble of the DQS signal, and the 4 signal transitions between times $t_5$ and $t_8$ serve as the portion of the DQS signal that clocks write data into the memory device.

As mentioned above, the $DQS_{EN}$ signal is coupled to both the Enable Even and the Enable Odd inputs of the transmitter 50. As explained above with reference to FIGS. 3 and 4, the high Enable Even and Enable Odd signals shown in lines 8 and 9, respectively, produce the Serialized Enable signal shown in line 10. The high Serialized Enable signal enables the buffer 70 (FIG. 3) so that the Serialized Data signal shown in line 13 is output from the test system 10 as the DQS signal shown in line 14. Insofar as the buffer 70 is not enabled until the Serialized Enable signal transitions high at time $t_2$, the logic low portion of the Serialized Data signal between times $t_1$ and $t_2$ is not output from the buffer 70. The timing of the Serialized Enable signal, which, as explained above, is controlled by the phase of the interpolator 20, thus determines the starting time of the preamble of the DQS signal.

With further reference to FIGS. 4 and 5, the DQS signal postamble terminates at time $t_9$ responsive to the Serialized Enable signal transitioning inactive low. Serialized Enable signal becomes logic low at time $t_9$ because $DQS_{E1}$ signal at the output of the flip-flop 36 (FIG. 2) goes low responsive to the falling edge of the $CLK_{IN}$ signal since the ENABLE signal had previously transitioned low before to the previous rising edge of the $CLK_{IN}$ signal, thereby making the $DQS_{E0}$ signal low. Therefore, by controlling the timing of the $CLK_{IN}$ signal, the phase interpolator 20 also determined the timing of the end of the postamble.

Although only one example is shown in FIG. 5, it should be understood that the test system 10 can control the duration of the DQS preamble and postamble to any desired value. Furthermore, since the duration of the DQS preamble and postamble is controlled by the phase interpolator 20, which inherently can be made very precise, the duration of the DQS preamble and postamble can be precisely controlled. Also, by varying the timing of the phase interpolator 20, the duration of the DQS preamble and postamble can still be controlled if the phase interpolators 24, 28 are adjusted to vary the timing of the DQS transitions during the testing of a memory device.

Figure 6:
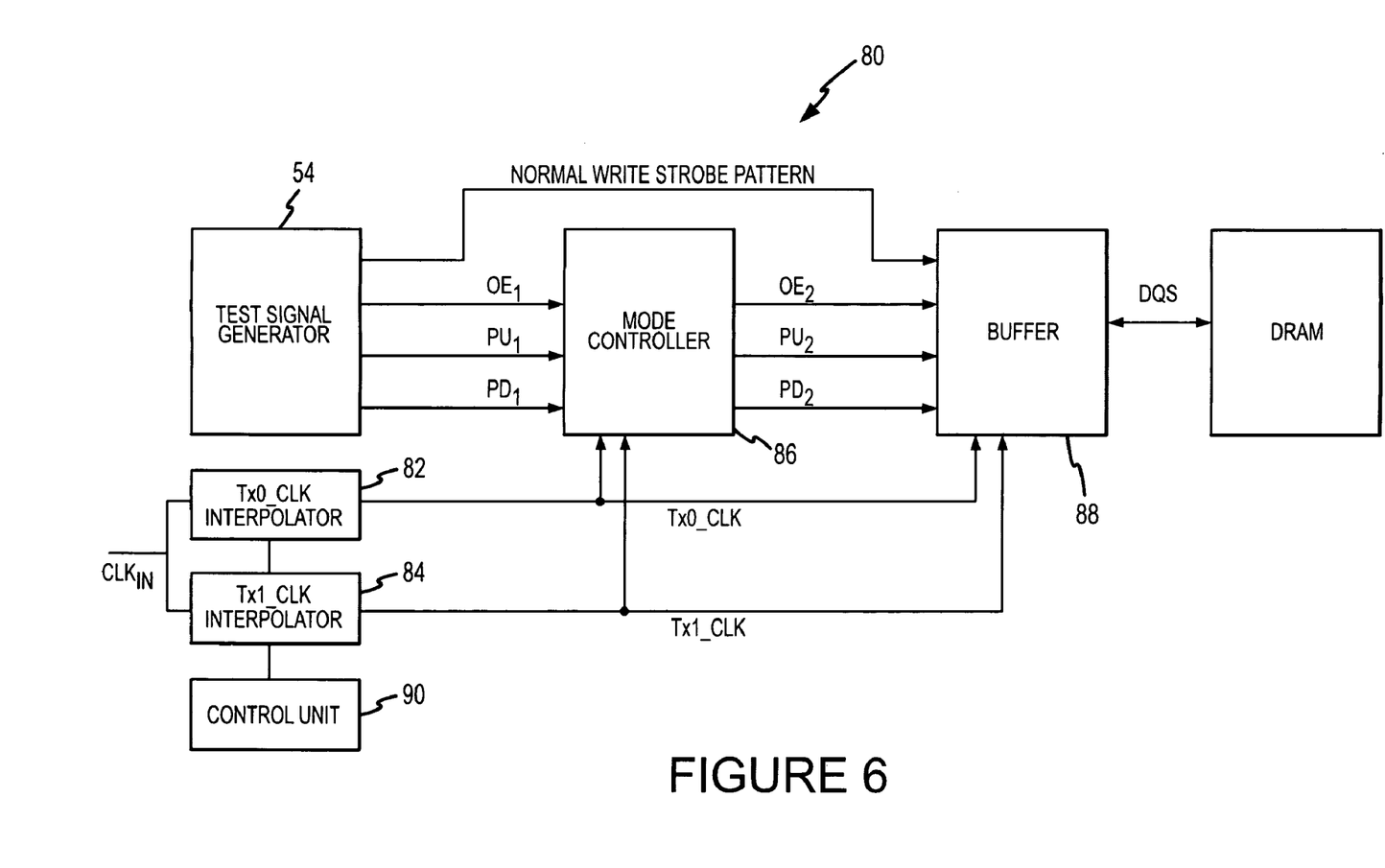
FIG. 6 is a block diagram of a write strobe preamble/postamble test system according to one example of the invention.

A write strobe preamble/postamble test system 80 according to another example of the invention is shown in FIG. 6. The system 80 has the advantage of using fewer phase interpolations that are used on the system 10 of FIG. 2, and thus uses a smaller area of a semiconductor die and less power. The system 80 includes the test signal generator 54 as well as two phase interpolators 82, 84 receiving the $CLK_{IN}$ signal. The test signal generator 54 outputs signals that will result in a DQS signal during normal testing of a memory device and during testing of the DQS preamble/postamble timing margins. The test system 80 also includes a mode controller 86, which receives an Output Enable ("$OE_1$") signal and Dynamic Termination Pull-Up ("$PU_1$") and Pull-Down ("$PD_1$") Control signals from the test signal generator 54. The mode controller 86, in turn, applies an Output Enable ("$OE_2$") signal and Dynamic Termination Pull-Up ("$PU_2$") and Pull-Down ("$PD_2$") Control signals to a buffer 88, which outputs a DQS signal to a memory device being tested. In normal operation, a DQS signal may also be applied to the buffer 88.

The phase shift provided by the phase interpolators 82, 84, as well as the operation of the mode controller 86, is controlled by a control unit 90. The phase interpolators interpolate between the phase of the rising edge of the $CLK_{IN}$ signal and the phase of either the next falling edge (i.e., 180°) or the next rising edge (i.e., 360°) of the $CLK_{IN}$ signal.

In the normal operating mode, the test signal generator 54 provides Normal Write Strobe ("$DQS_{NORMAL}$") pattern, which bypasses the mode controller 86 and is applied directly to the buffer 88. The $DQS_{NORMAL}$ signal is representative of a two-part, even and odd, datapath to be serialized having its logic levels output from the buffer 88 responsive to the rising edge of the Tx0 signal and the rising edge of the Tx1 signal. Also, in the normal mode, the $OE_1$ signal passes through the mode controller 86 to become the $OE_2$ signal, which selectively enables the buffer 88. Finally, the $PU_1$ or $PD_1$ signals are also effectively coupled through the mode controller 86 to become the $PU_2$ and $PD_2$ signals, respectively. As is well known in the art, the $PU_2$ or $PD_2$ signals cause the buffer 88 output terminal to be biased to either a high logic level or a low logic level, respectively, when the buffer 88 is not outputting a DQS signal and an incoming DQS signal may be applied to the output terminal of the buffer 88.

In the DQS preamble/postamble timing margin test mode, the $PU_1$ and $PD_1$ signals are output from the mode controller 86 and applied to the buffer 88 as the $PU_2$ and $PD_2$ signals, respectively, responsive to a high Tx0 signal. However, the $PU_2$ and $PD_2$ signals are output from the mode controller 86 only when the mode controller 86 has been enabled. Therefore, when the mode controller has been enabled, the timing of the Tx0 signal at the output of the phase interpolator 82 therefore controls the timing of the $PU_2$ or $PD_2$ signals being output from the mode controller 86.

The mode controller 86 is enabled responsive to receiving an active $OE_1$ upon the rising edge of the Tx1 signal. Therefore, the timing of the Tx1 signal at the output of the phase interpolator 84 controls the enabling of the mode controller 86 to allow the DQS signal corresponding to the $PU_2$ or $PD_2$ signals to be output from the buffer 88. The width of the DQS preamble and postamble is thus determined by the timing of the Tx1 signal relative to the timing of the Tx0 signal. The test system 80 is therefore very similar to the test system 10 of FIG. 2 in that the widths of the DQS preambles and postambles are controlled by the timing of an enable signal, which is, in turn, controlled by the timing of a signal generated by a phase interpolator 20 (FIG. 2) and 84 (FIG. 6).

Figure 7:
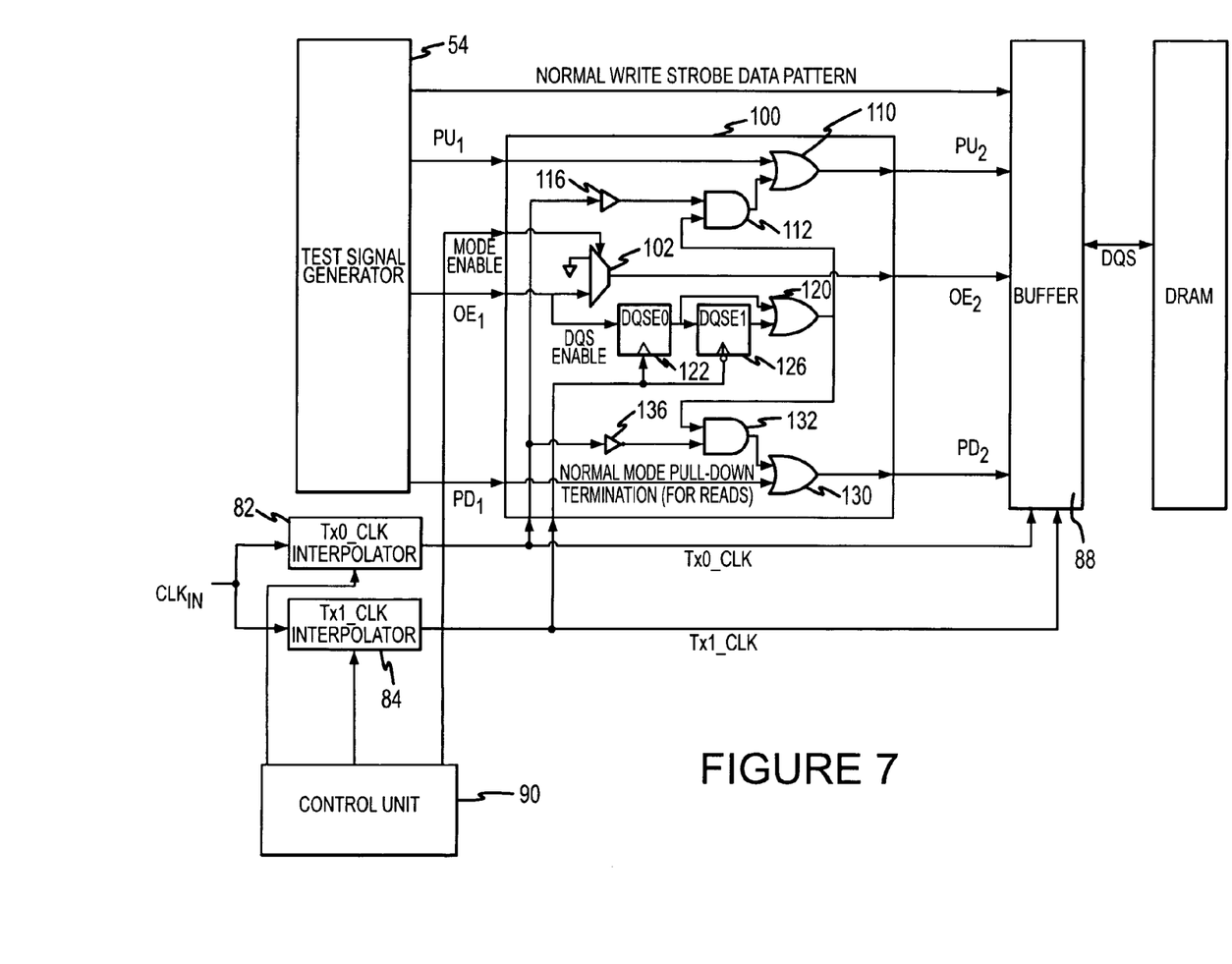
FIG. 7 is a block diagram of one example of a mode controller that is used in the test system of FIG. 6.
Figure 8:
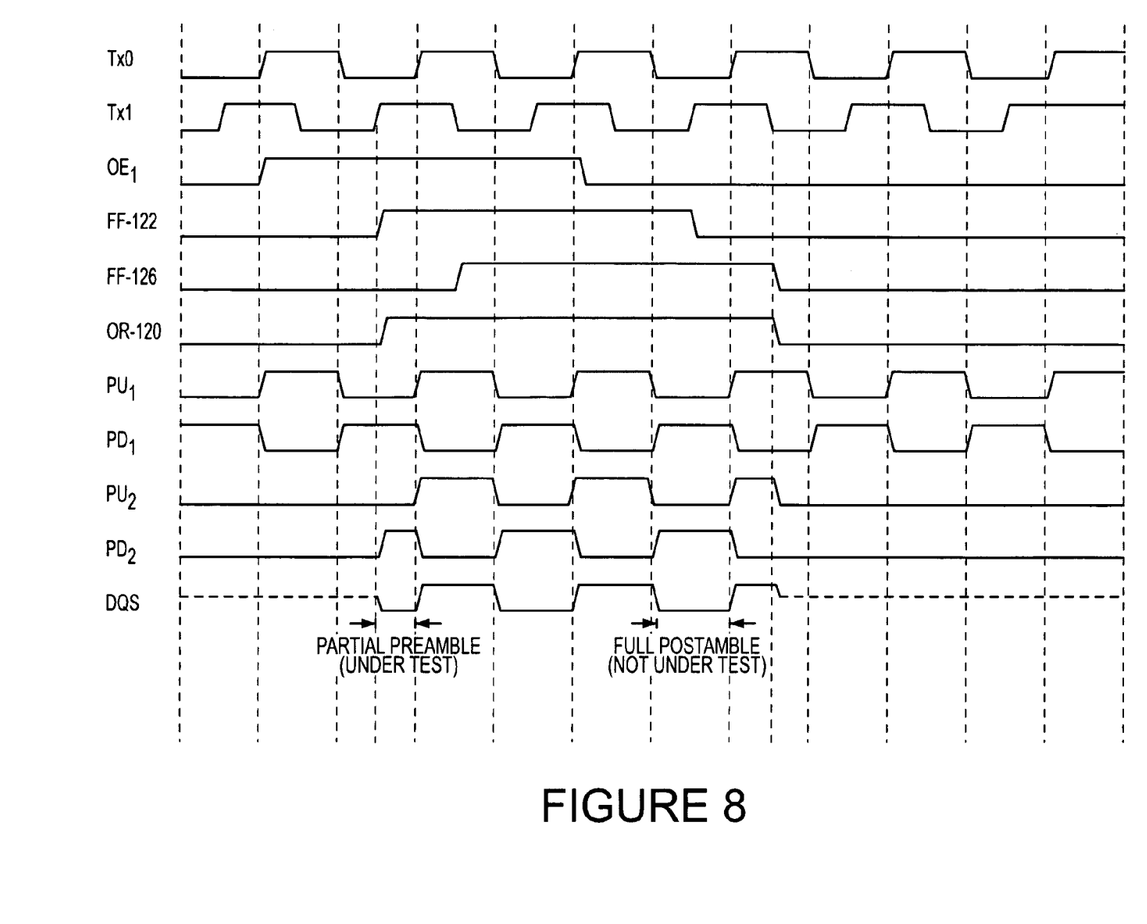
FIG. 8 is a timing diagram showing one example of signals that are present in the mode controller of FIG. 7.

A mode controller 100 that can be used as the mode controller 86 in the test system 80 of FIG. 6 is shown in FIG. 7, and some of the signals present in the mode controller 86 are shown in FIG. 8. The mode controller 100 receives the $OE_1$ signal at one input of multiplexer 102, and the other input of the multiplexer 102 is coupled to ground. The multiplexer 102 is controlled by a Mode Enable signal, which is generated by the control unit 90 (FIG. 6). In the normal operating mode, the multiplexer 102 couples the $OE_1$ signal to the output to become the $OE_2$ signal, as previously mentioned. In the DQS preamble/postamble timing margin test mode, the multiplexer 102 connects the output to ground to hold the $OE_2$ signal applied to the buffer 88 (FIG. 6) at an inactive low level.

The $PU_1$ signal from test signal generator 54 is applied to one input of an OR gate 110, and is conveyed directly to signal $PU_2$ for use in normal operating mode. In DQS preamble/postamble timing margin test mode, the second input of OR gate 110 receives a pull-up test pattern from the output of AND gate 112. The AND gate 112 generates a high output whenever a high Tx0 signal at the output of the phase interpolator 82 is coupled through a buffer 116 and the AND gate 112 is enabled by a high being applied to its other input. As shown in FIG. 8, this enabling high is coupled to the input of the AND gate 112 by an OR gate 120 after an active high $OE_1$ signal has been clocked into a flip-flop 122 responsive to the rising edge of the Tx1 signal. On the next falling edge of the Tx1 signal, the high at the output of the flip-flop 122 is clocked into a second flip-flop 126 so that both inputs of the OR gate 120 are high, as also shown in FIG. 8. The output of the OR gate 120 therefore remains high to enable the AND gate 112 after the $OE_1$ signal has transitioned low until a rising edge of the Tx1 signal followed by a falling edge of the Tx1 signal have occurred.

A second OR gate 130, AND gate 132 and inverter 136 produce the $PD_2$ signal operate in the same manner that the $PU_2$ signals was generated responsive to the $PD_1$ signal with a timing controlled by the timing of the Tx1 signal relative to the timing of the Tx0 signal.

It can therefore be seen from the signals shown in FIG. 8 that, the timing of the Tx0 signal output from the phase interpolator 82 controls the timing that the $PU_2$ and $PD_2$ signals that would be output from the mode controller 100. However, these signals cannot be output from the mode controller 100 until the AND gate 112 has been enabled. Yet the timing of the AND gate 112 becoming enabled by the $OE_1$ signal is controlled by the rising edge of the Tx1 signal output from the phase interpolator 84. Therefore, as shown in the bottom line of FIG. 8, the width of the DQS preamble corresponds to the lag of the Tx0 signal from the Tx1 signal. Such is the operation while the width of the DQS preamble is under test. Furthermore, the width of the DQS postamble can be placed under test instead of the DQS preamble by increasing the lead of the Tx1 signal relative to the Tx0 signal. In such case, it is the falling edge of signal Tx1 which ends the high output from AND gate 112. Controlling the output of phase interpolator 84 can delay the beginning of the DQS preamble or accelerate the ending of the DQS postamble, allowing either region to be tested.

Figure 9:
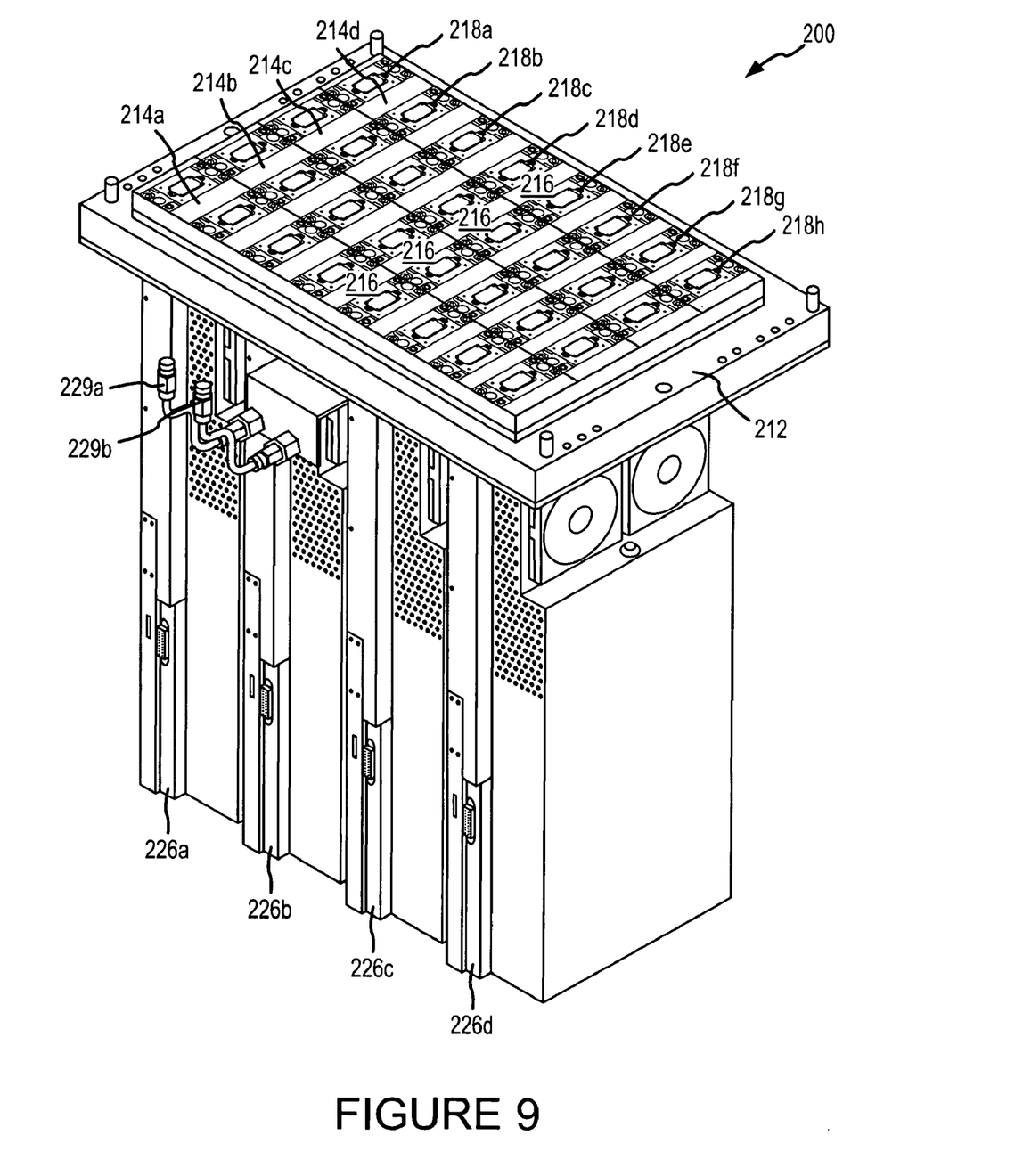
FIG. 9 is an isometric view of a memory device test system according to one example of the invention that may use the write strobe preamble/postamble test system of FIG. 2 or a write strobe preamble/postamble test system according to another example of the invention.

A memory device test system 200 that can use the write strobe preamble/postamble test system of FIG. 2, the write strobe preamble/postamble test system of FIGS. 6 and 7 or a write strobe preamble/postamble test system according to another example of the invention is shown in FIG. 9. The memory device test system 200 includes a test head 212 on which several load boards 214a-d are placed. Each of the load boards 214a-d have a printed circuit substrate 216 on which several integrated circuit sockets 218a-h are mounted. Each of the integrated circuit sockets 218a-h received a respective memory device (not shown in FIG. 8). In the example shown in FIG. 9, the sockets 218a-h are adapted to receive dynamic random access memory ("DRAM") devices. Prior to final testing of the memory devices, an integrated circuit handler loads a memory device into each of the sockets 218a-h, and then places each of the load boards 214a-d on the test head 212.

As explained in greater detail below, each of the load boards 214a-d includes an integrated test circuit (not shown in FIG. 9) mounted on the surface of the substrate 216 opposite the surface on which the sockets 218a-h are mounted. The sockets 218a-h are shown mounted on the upper surface of the substrate 216 in greater detail in FIG. 10A.

Figure 10A:
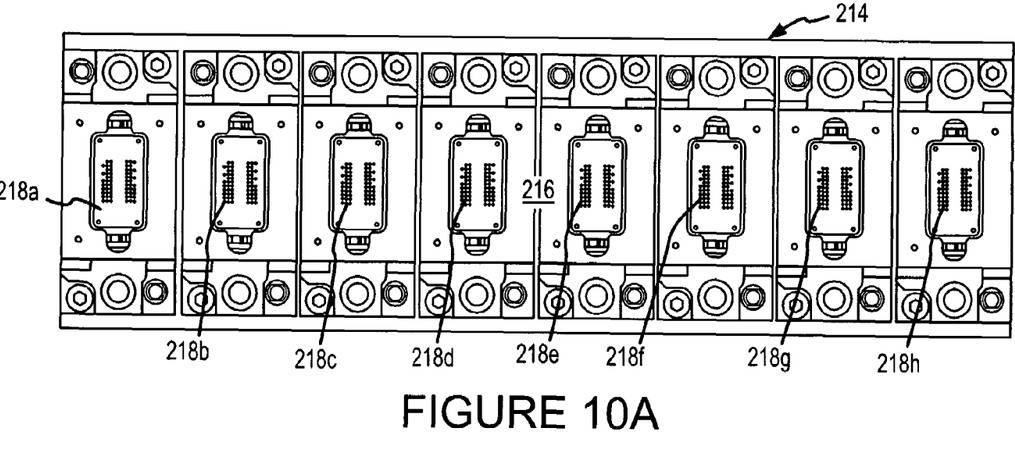
FIGS. 10A and 10B are top and bottom plan views, respectively, of a load board used in the test system of FIG. 8.
Figure 10B:
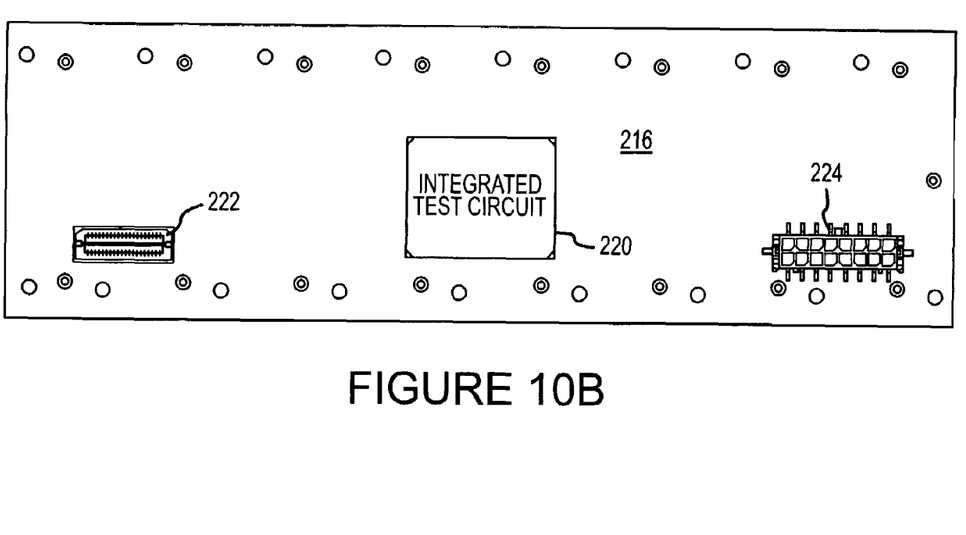

The lower surface of the substrate 216 is shown in FIG. 10B. The integrated test circuit 220 is mounted at the center of the substrate 216, and it is connected to the sockets 218a-h (FIG. 10A) through conventional printed circuit traces (not shown in FIG. 10B). Also mounted on the lower surface of the substrate 216 are a conventional JTAG connector 222 and a power supply connector 224. High-level test commands are applied to the test circuit 220 through the JTAG connector 222, and high-level results data are received from the test circuit 220 through the JTAG connector 222. Power is applied to the test circuit 220 as well as to memory devices mounted in the sockets 218a-h through the power supply connector 224.

In operation, the test circuit 220 applies a pattern of signals to the memory devices mounted in the sockets 218a-h, and receives signals from the memory devices indicative of the response of the memory devices to the pattern of signals. More particularly, the test circuit 220 writes data to the memory devices in the integrated circuit sockets 218a-h using DQS signals having a range of preamble and postamble durations. The test circuit 220 then reads the data from the memory devices in the sockets 218a-h to determine if data were successfully written to the memory devices using DQS signals having each preamble and postamble duration. The test circuit 220 is therefore able to determine whether the memory devices in the sockets meet the DQS preamble and postamble specifications. The test circuit 220 preferably also test other timing margins by varying the timing of other signals, such as write data signals, in order to completely test the memory devices. Insofar as the integrated test circuit 220 is mounted on the same substrate 216 as the memory devices, the timing at which the pattern of signals are applied to the memory devices can be more precisely controlled. Furthermore, the relatively short length of the conductors and extending from the integrated test circuit 220 to the integrated circuits in the sockets 218a-h allows the circuitry in the test circuit 220 to be less complex and therefore less expensive than with testers in which a pattern of test signals is applied through a long cable.

With further reference to FIG. 9, the test head 212 is mounted on the upper ends of several power supplies 226a-d, which generate DC supply voltages at respective magnitudes for use by the test head 212 and the load boards 214a-d. As mentioned above, the DC supply voltages are applied to the test head 212 through the power supply connector 224 (FIG. 10B). The test head 212 also includes fluid couplings 226a,b that receive and discharge a cooling fluid, respectively, for maintaining the temperature of the test circuit 220 at a stable acceptably cool temperature.

Although the present invention has been described with reference to the disclosed examples, persons skilled in the art will recognize that changes may be made in form and detail without departing from the spirit and scope of the invention. Such modifications are well within the skill of those ordinarily skilled in the art. Accordingly, the invention is not limited except as by the appended claims.

We claim:

1. A write strobe preamble/postamble test system, comprising:
    a write strobe generator operable to generate a digital signal having a selectable number of transitions between first and second logic levels;
    a phase interpolator receiving an input clock signal and generating an enable clock signal having a phase relative to the phase of the input clock signal that is controlled by a phase control signal;
    an enable circuit coupled to receive the enable clock signal from the phase interpolator, the enable circuit being operable to generate an active enable signal in synchronization with a transition of the enable clock signal responsive to receiving a DQS enable signal;
    a transmitter coupled to receive the digital signal from the write strobe generator and the enable signal from the enable circuit, the transmitter being operable to transmit as a write strobe signal the digital signal responsive to the enable signal being active; and
    a control circuit coupled to the enable circuit and the phase interpolator, the control circuit being operable to apply the DQS enable signal to the enable circuit and to apply the phase control signal to the phase interpolator to control the timing and duration of the enable signal generated by enable circuit.

2. The test system of claim 1 wherein the enable circuit comprises a first flip-flop having a data input coupled to the control circuit to receive the DQS enable signal, the first flip-flop further having a clock input coupled to the phase interpolator to receive the enable clock signal.

3. The test system of claim 2 wherein the enable circuit further comprises:
    an inverter having an input coupled to the phase interpolator to receive the enable clock signal, the inverter generating a complimentary enable clock signal;
    a second flip-flop having a data input coupled to receive an output signal from the first flip-flop, the second flip-flop further having a clock input coupled to an output of the inverter to receive the complimentary clock signal; and
    a logic gate having respective inputs coupled to the output of the first flip-flop and the output of the second flip-flop, the logic gate having an output from which the enable signal is generated.

4. The test circuit of claim 1 wherein the transmitter comprises a buffer having an input coupled to the write strobe generator to receive the digital signal, and having an enable input coupled to the enable circuit to receive the enable signal.

5. The test circuit of claim 1 wherein the write strobe generator is operable to generate first and second digital signals each of which has a selectable number of transitions between first and second logic levels.

6. The test circuit of claim 5, further comprising:
    a second phase interpolator having an input receiving a clock signal and an output generating a first transmit clock signal having a phase relative to the phase of the clock signal that is controlled by a first transmit phase control signal received from the control circuit;
    a third phase interpolator having an input receiving a clock signal and an output generating a second transmit clock signal having a phase relative to the phase of the clock signal that is controlled by a second transmit phase control signal received from the control circuit; and
    wherein the transmitter, when enabled, is operable to transmit as the write strobe signal the first digital signal responsive to transitions of the first transmit clock signal and the second digital signal responsive to transitions of the second transmit clock signal.

7. The test system of claim 6 wherein the transmitter comprises:
    a logic gate having respective inputs coupled to the second and third phase interpolators to receive the first and second digital signals, respectively, the logic gate having an output from which a multiplexer control signal is generated having a first value responsive to a predetermined transition of the first transmit clock signal and having a second value responsive to the predetermined transition of the second transmit clock signal; and
    a multiplexer having first and second inputs coupled to the write strobe generator to receive the first and second digital signals, respectively, the multiplexer having a control input coupled to an output from the logic gate to receive the multiplexer control signal, the multiplexer being operable to couple the first digital signal to an output responsive to the first value of the multiplexer control signal and being operable to couple the second digital signal to the output responsive to the second value of the multiplexer control signal.

8. The test circuit of claim 7 wherein the transmitter further comprises a buffer having an input coupled to the output of the multiplexer and having an enable input coupled to receive the enable signal from the enable circuit.

9. The test circuit of claim 6 wherein the clock signal applied to the input of the second phase interpolator is the same as the clock signal applied to the input of the third phase interpolator.

10. The test circuit of claim 1 wherein the enable circuit comprises a mode controller that, in a normal test mode, is operable to couple the active enable signals directly to an output terminal.

11. The test circuit of claim 1 wherein the write strobe generator is operable to generate a pull-up signal and a pull-down signal each of which has a selectable number of transitions between first and second logic levels, and wherein the transmitter includes output termination circuitry that is operable to bias an output terminal on which the write strobe signal is generated to either a first logic level or a second logic level, the output termination circuit being operable to bias the output terminal to the first logic level responsive to receipt of the pull-up signal and being operable to bias the output terminal to the second logic level responsive to receipt of the pull-down signal.

12. A memory device testing system, comprising:
an integrated test circuit being operable to output test signals and to receive response signals, the integrated test circuit having an output port from which test results data derived from the response signals are output; and
write strobe preamble/postamble testing circuitry included in the integrated test circuit, the write strobe preamble/postamble testing circuitry comprising:
a write strobe generator operable to generate a digital signal having a selectable number of transitions between first and second logic levels;
a phase interpolator receiving an input clock signal and generating an enable clock signal having a phase relative to the phase of the input clock signal that is controlled by a phase control signal;
an enable circuit coupled to receive the enable clock signal from the phase interpolator, the enable circuit being operable to generate an active enable signal in synchronization with a transition of the enable clock signal responsive to receiving a DQS enable signal;
a transmitter coupled to receive the digital signal from the write strobe generator and the enable signal from the enable circuit, the transmitter being operable to transmit as a write strobe signal the digital signal responsive to the enable signal being active; and
a control circuit coupled to the enable circuit and the phase interpolator, the control circuit being operable to apply the DQS enable signal to the enable circuit and to apply the phase control signal to the phase interpolator to control the timing and duration of the enable signal generated by enable circuit.

13. The memory device testing system of claim 12 wherein the enable circuit comprises a first flip-flop having a data input coupled to the control circuit to receive the DQS enable signal, the first flip-flop further having a clock input coupled to the phase interpolator to receive the enable clock signal.

14. The memory device testing system of claim 13 wherein the enable circuit further comprises:
an inverter having an input coupled to the phase interpolator to receive the enable clock signal, the inverter generating a complimentary enable clock signal;
a second flip-flop having a data input coupled to receive an output signal from the first flip-flop, the second flip-flop further having a clock input coupled to an output of the inverter to receive the complimentary clock signal; and
a logic gate having respective inputs coupled to the output of the first flip-flop and the output of the second flip-flop, the logic gate having an output from which the enable signal is generated.

15. The memory device testing system of claim 12 wherein the transmitter comprises a buffer having an input coupled to the write strobe generator to receive the digital signal, and having an enable input coupled to the enable circuit to receive the enable signal.

16. The memory device testing system of claim 12 wherein the write strobe generator is operable to generate first and second digital signals each of which has a selectable number of transitions between first and second logic levels.

17. The memory device testing system of claim 16, further comprising:
a second phase interpolator having an input receiving a clock signal and an output generating a first transmit clock signal having a phase relative to the phase of the clock signal that is controlled by a first transmit phase control signal received from the control circuit;
a third phase interpolator having an input receiving a clock signal and an output generating a second transmit clock signal having a phase relative to the phase of the clock signal that is controlled by a second transmit phase control signal received from the control circuit; and
wherein the transmitter, when enabled, is operable to transmit as the write strobe signal the first digital signal responsive to transitions of the first transmit clock signal and the second digital signal responsive to transitions of the second transmit clock signal.

18. The memory device testing system of claim 17 wherein the transmitter comprises:
a logic gate having respective inputs coupled to the second and third phase interpolators to receive the first and second digital signals, respectively, the logic gate having an output from which a multiplexer control signal is generated having a first value responsive to a predetermined transition of the first transmit clock signal and having a second value responsive to the predetermined transition of the second transmit clock signal; and
a multiplexer having first and second inputs coupled to the write strobe generator to receive the first and second digital signals, respectively, the multiplexer having a control input coupled to an output from the logic gate to receive the multiplexer control signal, the multiplexer being operable to couple the first digital signal to an output responsive to the first value of the multiplexer control signal and being operable to couple the second digital signal to the output responsive to the second value of the multiplexer control signal.

19. The memory device testing system of claim 18 wherein the transmitter further comprises a buffer having an input coupled to the output of the multiplexer and having an enable input coupled to receive the enable signal from the enable circuit.

20. The memory device testing system of claim 17 wherein the clock signal applied to the input of the second phase interpolator is the same as the clock signal applied to the input of the third phase interpolator.

21. The memory device testing system of claim 12 wherein the enable circuit comprises a mode controller that, in a normal test mode, is operable to couple the active enable signals directly to an output terminal.

22. The memory device testing system of claim 12 wherein the write strobe generator is operable to generate a pull-up signal and a pull-down signal each of which has a selectable number of transitions between first and second logic levels, and wherein the transmitter includes output termination circuitry that is operable to bias an output terminal on which the write strobe signal is generated to either a first logic level or a second logic level, the output termination circuit being operable to bias the output terminal to the first logic level responsive to receipt of the pull-up signal and being operable to bias the output terminal to the second logic level responsive to receipt of the pull-down signal.

23. An integrated circuit load board, comprising:
a substrate;
a plurality of integrated circuit sockets mounted on the substrate; and
an integrated test circuit mounted on the substrate and coupled to the integrated circuit sockets, the integrated test circuit being operable to apply test signals to the integrated circuit sockets and to receive response signals from the integrated circuit sockets, the integrated test circuit having an output port from which test results data derived from the response signals are output, the integrated test circuit including write strobe preamble/postamble testing circuitry comprising:
a write strobe generator operable to generate a digital signal having a selectable number of transitions between first and second logic levels;
a phase interpolator receiving an input clock signal and generating an enable clock signal having a phase relative to the phase of the input clock signal that is controlled by a phase control signal;
an enable circuit coupled to receive the enable clock signal from the phase interpolator, the enable circuit being operable to generate an active enable signal in synchronization with a transition of the enable clock signal responsive to receiving a DQS enable signal;
a transmitter coupled to receive the digital signal from the write strobe generator and the enable signal from the enable circuit, the transmitter being operable to transmit as a write strobe signal the digital signal responsive to the enable signal being active; and
a control circuit coupled to the enable circuit and the phase interpolator, the control circuit being operable to apply the DQS enable signal to the enable circuit and to apply the phase control signal to the phase interpolator to control the timing and duration of the enable signal generated by enable circuit.

24. The load board of claim 23 wherein the enable circuit comprises a first flip-flop having a data input coupled to the control circuit to receive the DQS enable signal, the first flip-flop further having a clock input coupled to the phase interpolator to receive the enable clock signal.

25. The load board of claim 24 wherein the enable circuit further comprises:
an inverter having an input coupled to the phase interpolator to receive the enable clock signal, the inverter generating a complimentary enable clock signal;
a second flip-flop having a data input coupled to receive an output signal from the first flip-flop, the second flip-flop further having a clock input coupled to an output of the inverter to receive the complimentary clock signal; and
a logic gate having respective inputs coupled to the output of the first flip-flop and the output of the second flip-flop, the logic gate having an output from which the enable signal is generated.

26. The load board of claim 23 wherein the transmitter comprises a buffer having an input coupled to the write strobe generator to receive the digital signal, and having an enable input coupled to the enable circuit to receive the enable signal.

27. The load board of claim 23 wherein the write strobe generator is operable to generate first and second digital signals each of which has a selectable number of transitions between first and second logic levels.

28. The load board of claim 27, further comprising:
a second phase interpolator having an input receiving a clock signal and an output generating a first transmit clock signal having a phase relative to the phase of the clock signal that is controlled by a first transmit phase control signal received from the control circuit;
a third phase interpolator having an input receiving a clock signal and an output generating a second transmit clock signal having a phase relative to the phase of the clock signal that is controlled by a second transmit phase control signal received from the control circuit; and
wherein the transmitter, when enabled, is operable to transmit as the write strobe signal the first digital signal responsive to transitions of the first transmit clock signal and the second digital signal responsive to transitions of the second transmit clock signal.

29. The load board of claim 28 wherein the transmitter comprises:
a logic gate having respective inputs coupled to the second and third phase interpolators to receive the first and second digital signals, respectively, the logic gate having an output from which a multiplexer control signal is generated having a first value responsive to a predetermined transition of the first transmit clock signal and having a second value responsive to the predetermined transition of the second transmit clock signal; and
a multiplexer having first and second inputs coupled to the write strobe generator to receive the first and second digital signals, respectively, the multiplexer having a control input coupled to an output from the logic gate to receive the multiplexer control signal, the multiplexer being operable to couple the first digital signal to an output responsive to the first value of the multiplexer control signal and being operable to couple the second digital signal to the output responsive to the second value of the multiplexer control signal.

30. The load board of claim 29 wherein the transmitter further comprises a buffer having an input coupled to the output of the multiplexer and having an enable input coupled to receive the enable signal from the enable circuit.

31. The load board of claim 28 wherein the clock signal applied to the input of the second phase interpolator is the same as the clock signal applied to the input of the third phase interpolator.

32. The load board of claim 23 wherein the enable circuit comprises a mode controller that, in a normal test mode, is operable to couple the active enable signals directly to an output terminal.

33. The load board of claim 23 wherein the write strobe generator is operable to generate a pull-up signal and a pull-down signal each of which has a selectable number of transitions between first and second logic levels, and wherein the transmitter includes output termination circuitry that is operable to bias an output terminal on which the write strobe signal is generated to either a first logic level or a second logic level, the output termination circuit being operable to bias the output terminal to the first logic level responsive to receipt of the pull-up signal and being operable to bias the output terminal to the second logic level responsive to receipt of the pull-down signal.

34. A method of testing a memory device, comprising:
loading a plurality of memory devices on a load board;
generating write data signals on the load board responsive to a test command coupled to the load board;
generating write strobe signals by the acts of:
generating a digital signal having a selectable number of transitions between first and second logic levels;
generating an enable clock signal having a controllable phase relative to the phase of an input clock signal;
generating an active enable signal in synchronization with a transition of the enable clock signal;
using the digital signal as the write strobe signal when the enable signal is active;
controlling the phase of the enable clock signal relative to the phase of the input clock signal over a predetermined range so that a plurality of write strobe signals having a range of preamble or postamble durations are generated;
sequentially applying the write data signals and each of the plurality of the write strobe signals to one of the memory devices on the load board;
receiving read data signals from at least one of the memory devices on the load board;
determining whether the memory devices passed a write strobe preamble specification or a write strobe postamble specification based on a comparison between the write data signals and the read data signals.

35. The method of claim 34 wherein the act of generating a digital signal having a selectable number of transitions between first and second logic levels comprises generating first and second digital signals each of which has a selectable number of transitions between first and second logic levels.

36. The method of claim 34, further comprising:
generating a first transmit clock signal having a controllable phase relative to the phase of a clock signal;
generating a second transmit clock signal having a controllable phase relative to the phase of the clock signal; and
wherein the act of using the digital signal as the write strobe signal when the enable signal is active comprises using the first digital signal as the write strobe signal responsive to transitions of the first transmit clock signal and using the second digital signal as the write strobe signal responsive to transitions of the second transmit clock signal.

* * * * *